(12) United States Patent
Gewax et al.

(10) Patent No.: US 10,651,844 B2
(45) Date of Patent: May 12, 2020

(54) MULTIPLE CHIP SYNCHRONIZATION VIA SINGLE PIN MONITORING OF AN EXTERNAL TIMING CAPACITOR

(71) Applicant: Texas Instruments Incorporated, Dallas, TX (US)

(72) Inventors: Lawrence James Gewax, Dallas, TX (US); Kevin William Ziemer, Plano, TX (US); Ricky Dale Jordanger, Allen, TX (US); Hector Torres, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/190,871

(22) Filed: Nov. 14, 2018

(65) Prior Publication Data

US 2019/0386657 A1    Dec. 19, 2019

Related U.S. Application Data

(60) Provisional application No. 62/685,650, filed on Jun. 15, 2018.

(51) Int. Cl.
*H03L 7/00* (2006.01)
*H03K 17/687* (2006.01)
*G01R 19/165* (2006.01)

(52) U.S. Cl.
CPC ... *H03K 17/6871* (2013.01); *G01R 19/16552* (2013.01); *H03L 7/00* (2013.01)

(58) Field of Classification Search
CPC . H03K 17/6871; H03L 7/00; G01R 19/16552

USPC .......................................................... 327/142
See application file for complete search history.

(56) References Cited

U.S. PATENT DOCUMENTS

| | | | | |
|---|---|---|---|---|
| 6,118,829 | A * | 9/2000 | North ................ | H04L 25/0262 375/316 |
| 2011/0309889 | A1* | 12/2011 | Matsuzaki ........... | H03K 3/017 331/111 |
| 2013/0227330 | A1* | 8/2013 | Pelloie .................. | G06F 1/10 713/503 |

(Continued)

FOREIGN PATENT DOCUMENTS

| RU | 2268545 C2 | 1/2006 |
|---|---|---|
| SU | 815910 A1 | 3/1981 |

OTHER PUBLICATIONS

PCT Search Report dated Sep. 5, 2019.

*Primary Examiner* — Ryan Jager

(74) *Attorney, Agent, or Firm* — Lawrence J. Bassuk; Charles A. Brill; Frank D. Cimino

(57) ABSTRACT

An IC chip, a system and a method of operating the IC chip in response to an event trigger are provided. The method includes responsive to the event trigger, coupling a pin to a source of constant current to charge an external capacitor coupled to the pin and monitoring a capacitor voltage on the pin. If the magnitude of the capacitor voltage is greater than a rising threshold, detection of a falling threshold is enabled. If the magnitude of the capacitor voltage is greater than a voltage threshold, a first response is triggered and the pin is coupled to the lower rail to discharge the external capacitor. If detection of the falling threshold is enabled and the magnitude of the capacitor voltage is less than the falling threshold, the first response is also triggered.

17 Claims, 4 Drawing Sheets

(56) References Cited

U.S. PATENT DOCUMENTS

2014/0002169 A1   1/2014  Ramirez
2017/0115717 A1   4/2017  Shankar
2017/0244403 A1   8/2017  Beck
2017/0353099 A1* 12/2017  Yang ........................ H02M 1/08

* cited by examiner

MULTIPLE CHIP SYNCHRONIZATION VIA SINGLE PIN MONITORING OF AN EXTERNAL TIMING CAPACITOR

PRIORITY UNDER 35 U.S.C. § 119(e) & 37 C.F.R. § 1.78

This non-provisional application claims priority based upon the following prior United States provisional patent application(s): (i) "MULTIPLE MIXED-SIGNAL CHIP SYNCHRONIZATION VIA SINGLE-PIN DUAL-EDGE MONITORING OF AN EXTERNAL TIMING CAPACITOR," Application No. 62/685,650, filed Jun. 15, 2018, in the name(s) of Lawrence James Gewax, Kevin William Ziemer, Ricky Dale Jordanger and Hector Torres, which is hereby incorporated by reference in its entirety.

FIELD OF THE DISCLOSURE

Disclosed embodiments relate generally to the field of multi-chip synchronization. More particularly, and not by way of any limitation, the present disclosure is directed to a system, device and method for multiple chip synchronization via single-pin monitoring of an external timing capacitor.

BACKGROUND

One method of providing a delay or of timing an event using an integrated circuit (IC) chip is shown in FIG. 5, in which power supply system 500 is shown on a circuit board 502. Power supply system 500 includes an IC chip 504 that can be, for example, a load switch or a low-dropout (LDO) regulator. IC chip 504 is coupled to an input voltage Vin through pin Pa and provides an output voltage Vout through pin Pb. Although not specifically shown in this figure, a power transistor is coupled between input voltage Vin and output voltage Vout to control when a current is allowed to flow.

IC chip 504 contains a timing circuit 506, which is coupled to an external capacitor C1 through pin Pc. Timing circuit 506 is coupled to pin Pc in order to use an external capacitor C1 to time an event. For example, when a fault condition such as a short occurs at a load to which power supply system 500 is coupled, IC chip 504 may need to be turned off and then on to reset the IC chip. Typically, it is desirable for a given time period to elapse between the time IC chip 504 is turned off and when IC chip 504 is turned back on. Timing of the given time period can be provided by charging external capacitor C1 at a constant rate, e.g., using a current source, and detecting when external capacitor C1 has reached a threshold voltage that represents the expected time period.

When a large current is needed on Vout, two or more copies of IC chip 504 can be coupled in parallel between input voltage Vin and output voltage Vout in order to increase the current-carrying capabilities of the system. It will be recognized that when multiple IC chips 504 are coupled in parallel, the IC chips need to act synchronously whenever they are switched on or off. When the switching occurs due to a fault condition, synchronous action can be accomplished by coupling a respective timing circuit 506 from each IC chip 504 to external capacitor C1; each IC chip can help charge external capacitor C1 and can monitor the voltage on external capacitor C1. However, when combining existing IC chips in such a manner, unexpected issues can occur and cause the system to lose synchronization.

SUMMARY

Disclosed embodiments provide an IC chip and a method of operating the IC chip that includes monitoring two separate thresholds to identify the end of a timing period. All IC chips coupled to the external capacitor will help to charge the external capacitor and monitor whether the voltage threshold has been reached. Because the actual value of the voltage threshold can vary somewhat between different IC chips due to variations in semiconductor processing, once the voltage on the external capacitor has reached a rising threshold, the IC chip enables monitoring to detect crossing a falling threshold. Crossing the falling threshold indicates that another IC chip has reached the voltage threshold and is discharging the external capacitor. The rising threshold is selected such that the rising threshold is less than the voltage threshold minus a maximum random offset of the comparator that detects the voltage threshold. Thus, the first IC chip to reach a respective voltage threshold will recognize the end of the timing period and couple the external capacitor to the lower rail, causing the voltage to drop quickly. Remaining IC chips detect crossing the falling threshold to recognize the end of the timing period, allowing all IC chips to remain synchronized.

In one aspect, an embodiment of an IC chip is disclosed. The IC chip includes a first pin for coupling to a first external capacitor; and a first timing circuit coupled to the first pin, the first timing circuit operating to selectively couple the first pin to one of a first source of constant current and a lower rail, the first timing circuit being coupled, responsive to a first event trigger, to perform the following: couple the first pin to the first source of constant current; monitor a first capacitor voltage on the first pin; if the magnitude of the first capacitor voltage is greater than a first rising threshold, enable detection of a first falling threshold; if the magnitude of the first capacitor voltage is greater than a first voltage threshold, trigger a first response and couple the first pin to the lower rail; and if detection of the first falling threshold is enabled and the magnitude of the first capacitor voltage is less than the first falling threshold, trigger the first response.

In another aspect, an embodiment of a system is disclosed. The system includes a first integrated circuit (IC) chip mounted on a circuit board; a second IC chip mounted on the circuit board; and a first external capacitor mounted on the circuit board; wherein each of the first IC chip and the second IC chip comprises: a respective first pin coupled to the first external capacitor; and a respective first timing circuit coupled to the respective first pin, the respective first timing circuit operating to selectively couple the respective first pin to one of a respective first source of constant current and a lower rail, the respective first timing circuit being coupled, responsive to a first event trigger, to perform the following: couple the respective first pin to the respective first source of constant current; monitor a first capacitor voltage on the respective first pin; if the magnitude of the first capacitor voltage is greater than a respective first rising threshold, enable detection of a respective first falling threshold; if the magnitude of the first capacitor voltage is greater than a respective first voltage threshold, trigger a respective first response and couple the respective first pin to the lower rail; and if detection of the respective first falling threshold is enabled and the magnitude of the first capacitor voltage is less than the respective first falling threshold, trigger the respective first response.

In another aspect, an embodiment of a method of operating an integrated circuit (IC) chip in response to a first event trigger is disclosed. The method includes responsive to the first event trigger, coupling a first pin to a first source of constant current to charge a first external capacitor coupled to the first pin; monitoring a first capacitor voltage on the first pin; if the magnitude of the first capacitor voltage is greater than a first rising threshold, enable detection of a first falling threshold; if the magnitude of the first capacitor voltage is greater than a first voltage threshold, trigger a first response and couple the first pin to the lower rail to discharge the first external capacitor; and if detection of the first falling threshold is enabled and the magnitude of the first capacitor voltage is less than the first falling threshold, trigger the first response.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 1:
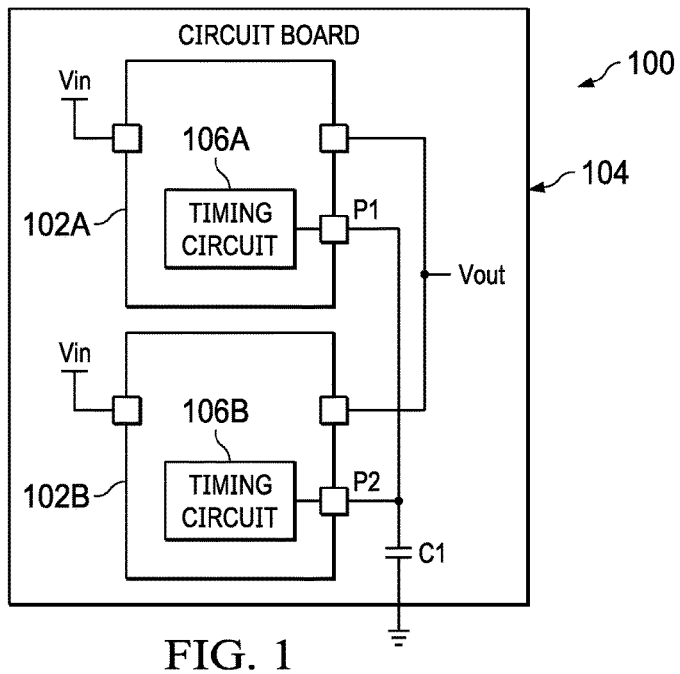
FIG. 1 depicts an example of a power supply system containing multiple IC chips coupled in parallel according to an embodiment of the disclosure.

FIG. 1 depicts an example power supply system 100 in which IC chips 102A, 102B need to provide a synchronized response to a trigger event such as a fault condition. In power supply system 100, IC chips 102A, 102B are mounted on circuit board 104 and are coupled in parallel between input voltage Vin and output voltage Vout. Each of IC chips 102A, 102B contains a timing circuit 106 that is coupled to a first terminal of external capacitor C1. It will be understood that although only two IC chips 102 are coupled in parallel in this example, a greater number of IC chips can be coupled in parallel as needed. In IC chip 102A, timing circuit 106A is coupled to first pin P1, which is coupled in turn to a first terminal of external capacitor C1, while in IC chip 102B, timing circuit 106B is coupled to second pin P2, which is also coupled to the first terminal of external capacitor C1. In one example embodiment, each of IC chips 102A, 102B is a single channel load switch.

When a trigger event occurs in power supply system 100, a source of constant current, e.g., a current source or current sink (not specifically shown in this figure), in each of timing circuits 106A and 106B is coupled to charge the capacitor. The value of the current source/sink, the number of IC chips 102 that are coupled in parallel, the capacitor value and a voltage threshold determine the timer duration. Once a respective source of current is coupled to charge the capacitor, each IC chip monitors the voltage on a respective pin P1, P2 to determine when the voltage on capacitor C1 crosses the voltage threshold, at which point a response is triggered. In one embodiment, when the trigger event or fault occurs, IC chips 102A, 102B are reset or restarted.

Figure 1A:
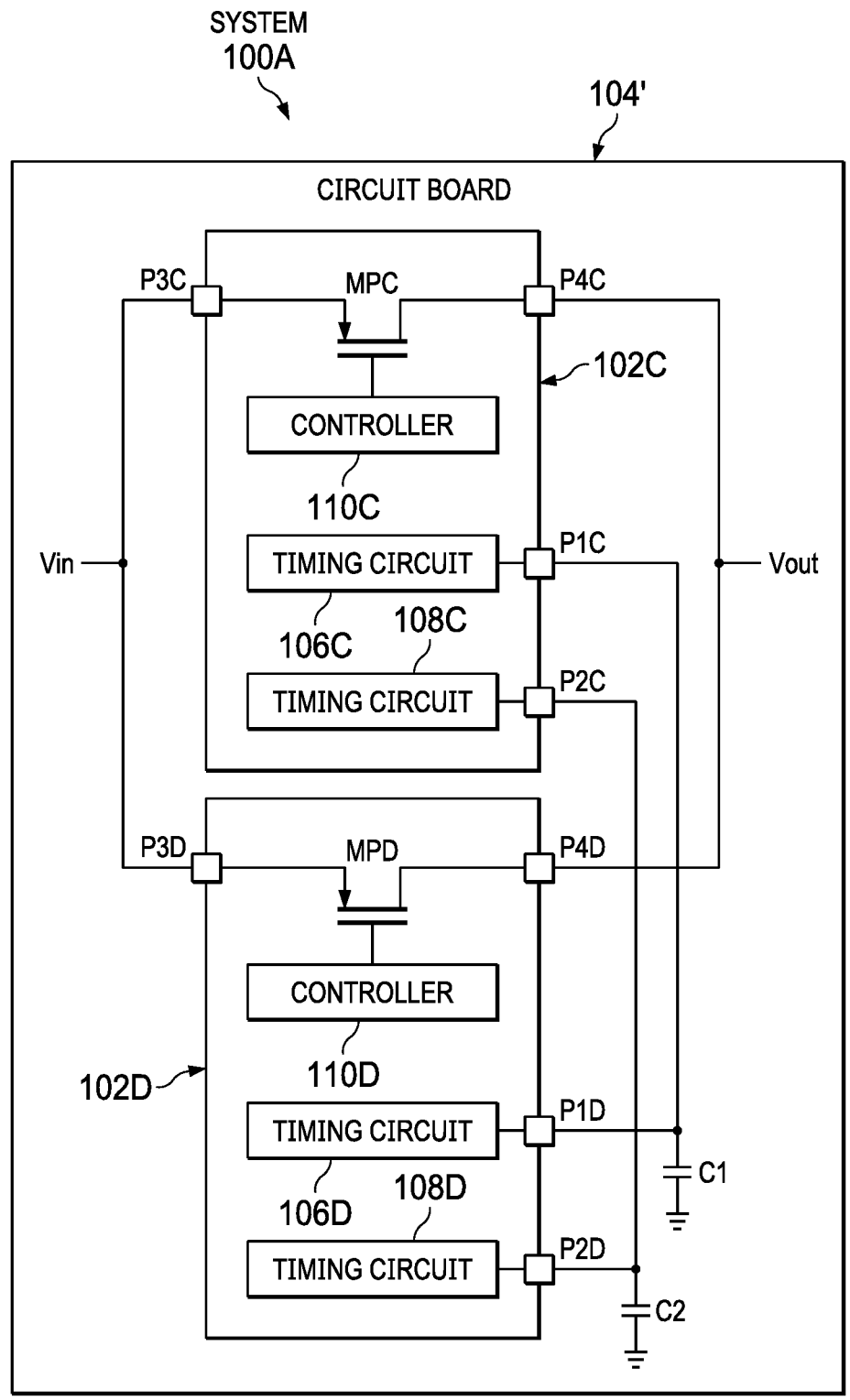
FIG. 1A depicts in somewhat greater detail a specific embodiment of a power supply system containing multiple IC chips coupled in parallel according to an embodiment of the disclosure.

A somewhat more specific implementation of a power supply system 100A is provided in FIG. 1A. In power supply system 100A, IC chips 102C, 102D are mixed-signal chips implemented as load switches and mounted on circuit board 104'. A third pin P3C of IC chip 102C and a third pin P3D of IC chip 102D are each coupled to input voltage Vin and fourth pins P4C, P4D are each coupled to output voltage Vout. P-type metal oxide silicon (PMOS) power transistor MPC is coupled between third pin P3C and fourth pin P4C and is controlled by controller 110C. Similarly, PMOS power transistor MPD is coupled between third pin P3D and fourth pin P4D and is controlled by controller 110D. Each of IC chips 102C, 102D contains two timing circuits 106, 108. Timing circuits 106C and 106D are coupled to first external capacitor C1 through respective first pins P1C, P1D. Each of timing circuits 106C, 106D are triggered when an over-current situation is detected. In order to ensure that there is a true over-current event, the IC chips 102 monitor the over-current for a given period of time, which is timed by timing circuits 106C, 106D. When the timing circuits 106C, 106D detect that the threshold voltage has been reached, timing circuits 106C, 106D turn off PMOS power transistors MPC, MPD and a second timer, implemented by timing circuits 108C, 108D, is triggered. Timing circuits 108C, 108D are coupled to second external capacitor C2 through respective second pins P2C, P2D. Each of timing circuits 108C, 108D measures a period of time until PMOS power transistors MPC, MPD are to be turned on again. When timing circuits 108C, 108D reach a respective threshold, PMOS power transistors MPC, MPD are turned on again. Although two timing circuits on an IC chip are shown in FIG. 1A, the disclosed embodiments are not limited to this number of timing circuits. Any number of timing circuits 106, 108 may be present on each IC chip 102 and operate according to the disclosed embodiments, allowing an extended or complex timing relationship to be maintained between two or more chips operating in parallel. Although power supply system 100A is depicted as a load switch, power supply system 100A can also include a low-dropout (LDO) regulator with the addition of a feedback mechanism (not specifically shown).

Figure 2A:
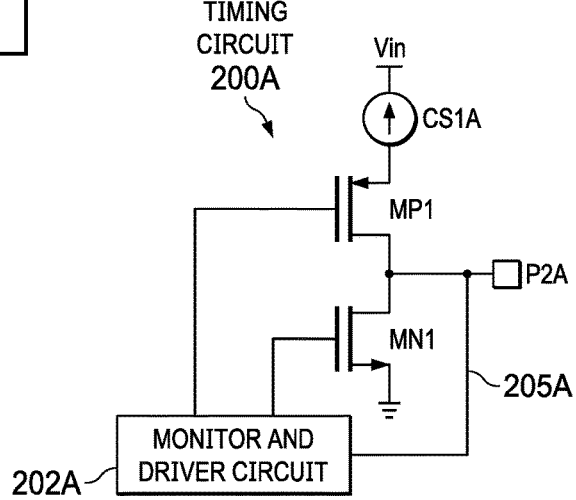
FIGS. 2A and 2B depict example timing circuits according to an embodiment of the disclosure.

Each of timing circuits 106, 108 can charge a first terminal of a respective external capacitor C1, C2 to either a positive value or a negative value using a source of current that can be either a current source or a current sink. FIG. 2A depicts a timing circuit 200A that charges an external capacitor to a positive value. A current source CS1A is coupled in series with PMOS transistor MP1 and N-type metal oxide silicon (NMOS) transistor MN1 between an upper rail and a lower rail, e.g., input voltage Vin and a ground plate. PMOS transistor MP1 and NMOS transistor MN1 are controlled by signals from monitor and driver circuit 202A such that pin P2A can be coupled to either receive a current provided by current source CS1A or discharge any voltage through the lower rail. Monitor and driver circuit 202A is coupled to monitor the capacitor voltage on pin P2A via connection 205A, to compare the detected capacitor voltage to a respective voltage threshold and to trigger a response when the detected capacitor voltage passes the voltage threshold.

Figure 2B:
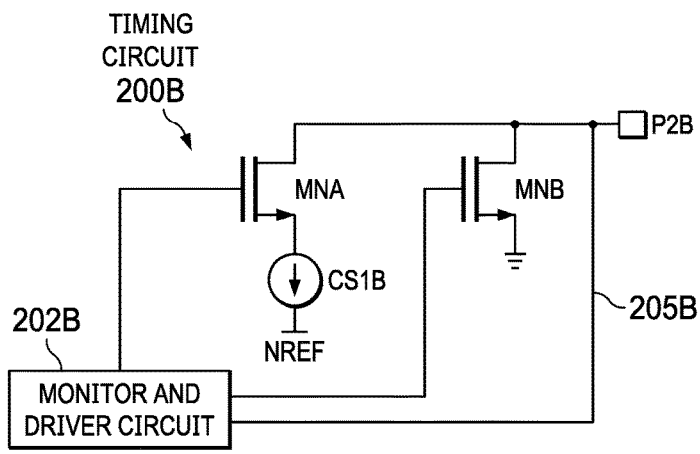

Similarly, FIG. 2B depicts a timing circuit 200B that charges an external capacitor C1, C2 to a negative value. NMOS transistor MNA and current sink CS1B are coupled in series between pin P2B and a negative reference voltage NREF such that current sink CS1B will pull current from pin P2B and a capacitor coupled thereto whenever NMOS transistor MNA is turned on. NMOS transistor MNB is coupled between pin P2B and the lower rail to discharge any negative charge on pin P2B and a respective capacitor whenever NMOS transistor MNB is on. NMOS transistors MNA, MNB are each controlled by monitor and driver circuit 202B. Monitor and driver circuit 202B is coupled to monitor a voltage on pin P2B using connection 205B, to compare the detected voltage to the threshold and to trigger a response when the detected capacitor voltage passes the voltage threshold. Because the timing circuits can be designed to charge a terminal of the external capacitor to either a positive value or a negative value, it will be understood that when we speak of the detected capacitor voltage being "greater" than a given threshold, the comparison is between the magnitude or absolute values of both the detected capacitor voltage and the given threshold.

In designing timing circuits 200A, 200B, monitor and driver circuits 202 were originally designed to detect when the voltage on the external capacitor exceeds a given voltage threshold and thereafter to trigger a response. However, due to the variations that occur in silicon processing, the respective voltage threshold can vary slightly for each IC chip. A problem that can be caused by these variations in the voltage threshold is discussed with reference to FIG. 3A.

Figure 3A:
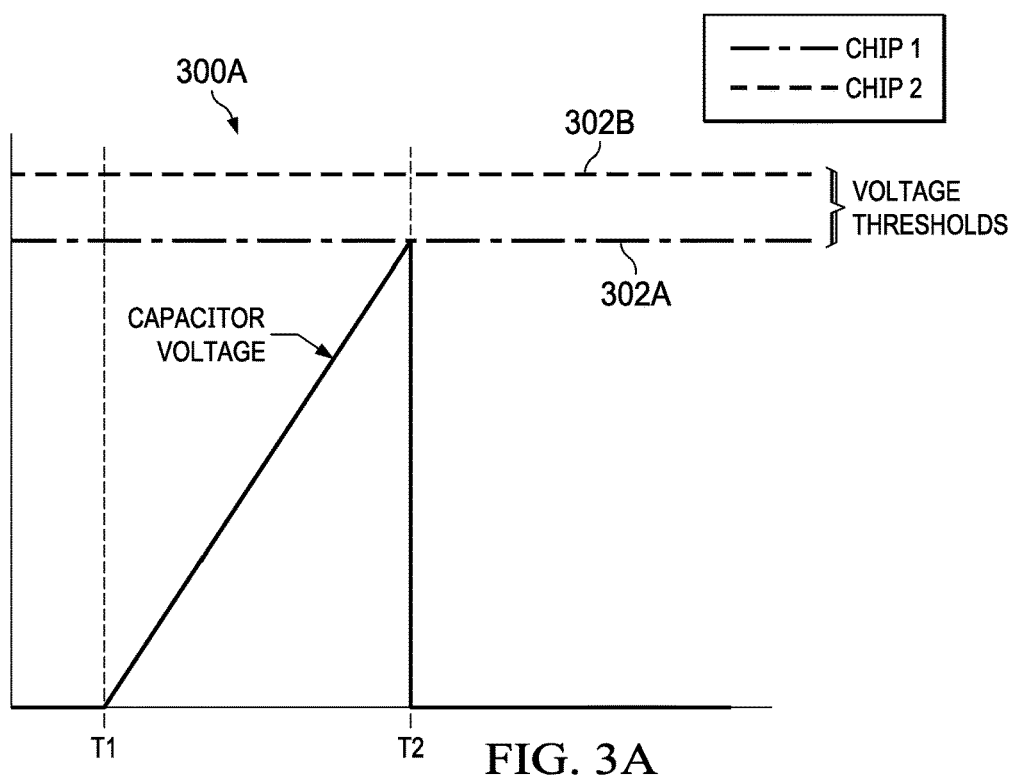
FIG. 3A depicts a graph that illustrates existing voltage thresholds on two IC chips that are coupled to an external timer capacitor but do not contain the disclosed enhancements.

In graph 300A, a first IC chip, e.g., IC chip 102A, has a slightly lower voltage threshold 302A than the voltage threshold 302B of a second IC chip, e.g., IC chip 102B, such that timing circuit 106A will detect the end of the timing period first. As seen in FIG. 3A, the voltage on external capacitor C1 is zero until a triggering event occurs at time T1. At time T1, both of the IC chips 102A, 102B begin to charge external capacitor C1 and the voltage thereon rises. When the first chip reaches voltage threshold 302A at time T2, the first IC chip disconnects the source of current from external capacitor C1 and couples external capacitor C1 to a ground plate that provides a lower rail, pulling the voltage on external capacitor C1 to local ground. In one embodiment, the first IC chip is also reset. Typically, each source of current provides a small current, while the pull-down strength from coupling to the ground plate is much greater than the source of current, so that as seen in FIG. 3A, the voltage on external capacitor C1 falls to zero quickly.

However, since the capacitor voltage never reached voltage threshold 302B, the second IC chip does not recognize that the voltage threshold has been reached and will continue to wait. Depending on the specific implementation of the IC chips, two results are possible. If the first IC chip is designed to couple external capacitor C1 to the lower rail even after the voltage has been brought to local ground, as is illustrated in FIG. 3A, the second IC chip will continue providing a charge, but the charge will not be able to charge external capacitor C1 and the second IC chip will never reach the voltage threshold.

In another implementation (not specifically shown), the first IC chip pulls external capacitor C1 to zero and then closes the coupling between the lower rail and external capacitor C1. In this implementation, the second IC chip is now the sole chip providing a charge to external capacitor C1, but will eventually manage to charge external capacitor C1 to the second voltage threshold. However, since the two voltage thresholds 302A, 302B were not reached simultaneously, the two IC chips are still out of synchronization with each other. The system may become locked and unable to move forward. Alternatively, a ping-pong effect can occur when one or more IC chips are pulling up the voltage on the capacitor while at least one IC chip has discharged the capacitor and is executing a next action that is to be taken when the time period is over. As operation continues, the IC chips can swap roles as to which are pulling up or pulling down at a given time. Because the IC chips are not synchronized to the same operating state, incorrect system behavior can occur. It is possible for the IC chips to continue to ping-pong and never resynchronize. Where the system is a load switch as in power supply system 100A, one IC chip may end up receiving all of the current that is intended to be spread across multiple IC chips, with potential consequences of destroying the IC chip.

To correct this problem, timing circuits 106, 108 are modified to also recognize when the capacitor voltage drops suddenly, indicating that another IC chip has reached the voltage threshold. This capability involves two new threshold values: a rising threshold and a falling threshold. In addition to detecting when the monitored capacitor voltage exceeds the voltage threshold, each of the timing circuits 106, 108 detect when the monitored capacitor voltage exceeds the rising threshold and also when the monitored capacitor voltage drops below a falling threshold. Because the falling threshold can be triggered even before charging on the capacitor begins, detection of the falling threshold is only enabled once the monitored capacitor voltage reaches the rising threshold, which is greater than the falling threshold but less than the voltage threshold. In one embodiment, the rising threshold is selected to be less than the voltage threshold minus a maximum random offset of the comparator that detects the voltage threshold. In operation, as the capacitor voltage rises, all of the IC chips will enable detection of the falling threshold once a respective rising threshold is reached. If a particular IC chip does not have the lowest voltage threshold of the group of IC chips in the system, the particular IC chip will still recognize when the monitored capacitor voltage drops below a respective falling threshold and can remain synchronized.

Figure 3B:
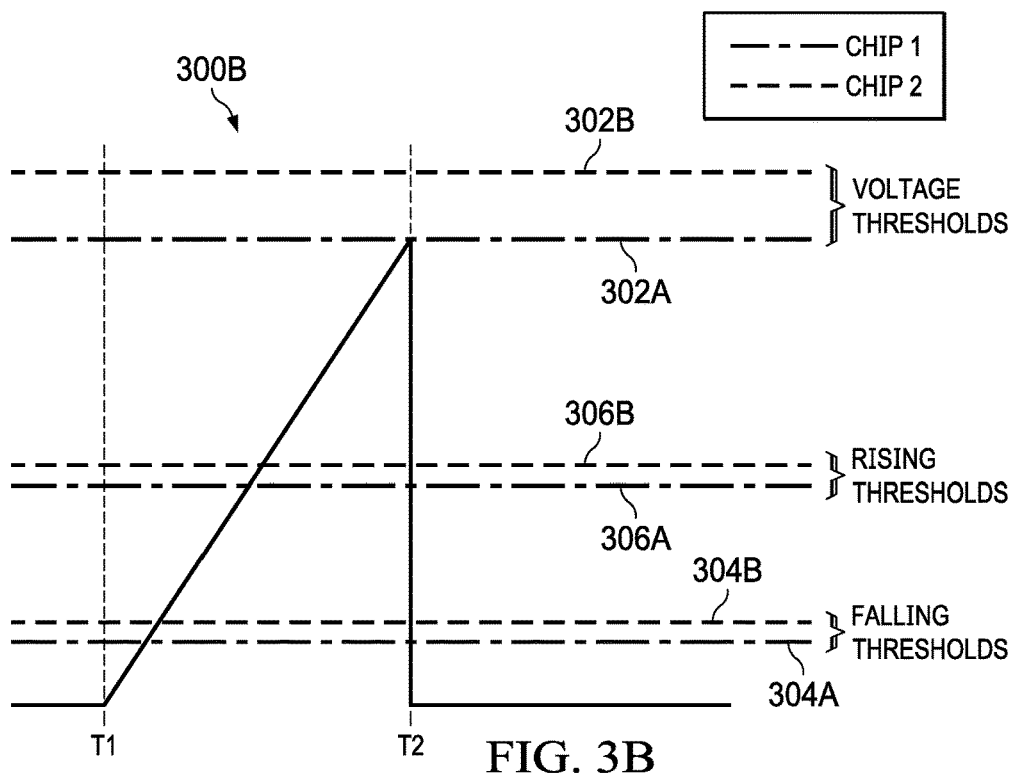
FIG. 3B depicts a graph that illustrates additional thresholds for two IC chips coupled to an external timer capacitor according to an embodiment of the disclosure.
Figure 4:
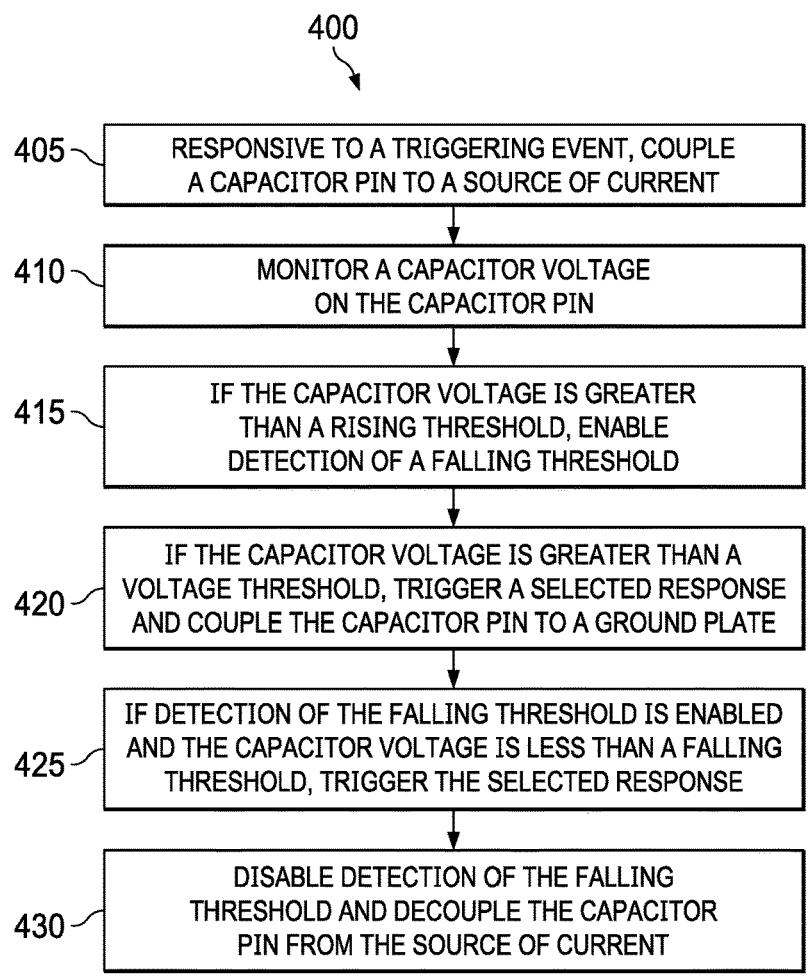
FIG. 4 depicts a method of operating an IC chip according to an embodiment of the disclosure.
Figure 5:
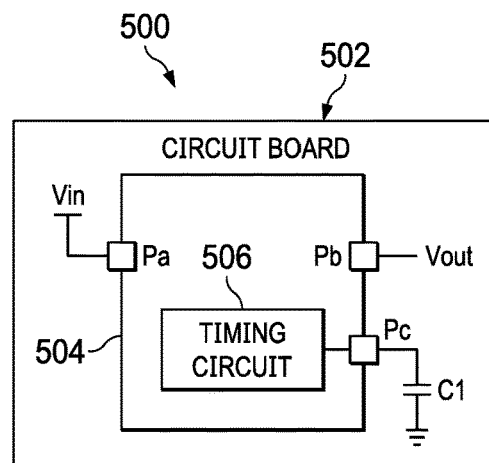
FIG. 5 depicts system that includes a single IC chip coupled to an external capacitor for timing an event on the IC chip.

Graph 300B in FIG. 3B illustrates the use of the new threshold values and is explained in conjunction with FIG. 4, which depicts a method 400 of operating an IC chip in response to an event trigger. A first IC chip has a voltage threshold 302A, a rising threshold 306A and a falling threshold 304A, while a second IC chip has a voltage threshold 302B, a rising threshold 306B and a falling threshold 304B. In embodiments in which more than two IC chips are coupled to the timing capacitor, the first IC chip is simply the IC chip that has the lowest voltage threshold of the coupled IC chips. All other IC chips that are coupled to the same timing capacitor can be treated as a second IC chip as explained herein. Only the IC chip with the lowest voltage threshold will typically discharge the capacitor, but each of the remaining IC chips will detect the end of the timing period and respond as designed. As in the previous example, each timing circuit is triggered at time T1; responsive to the triggering event, each IC chip couples 405 a capacitor pin, i.e., a pin that is designed for coupling to a capacitor, to a source of current, either a current source or a current sink depending on the implementation. In the embodiment shown, a current source is used and the capacitor voltage begins to rise. Each IC chip monitors 410 the capacitor voltage. If the capacitor voltage is greater than a respective rising threshold 306A, 306B, the corresponding IC chip will enable 415 detection of a respective falling threshold 304A, 304B. The capacitor voltage will continue to rise until the capacitor voltage reaches voltage threshold 302A at time T2. When the first IC chip detects that the pin voltage is greater than voltage threshold 302A, the first IC chip triggers 420 a selected response and couples the pin to the ground plate to discharge the capacitor. The selected response can be any desired result and can include resetting the IC chip, turning off a transistor that controls the output voltage, or turning on the transistor that controls the output voltage. Because detection of the falling threshold has previously been enabled on the second IC chip, when the second IC chip detects that the capacitor voltage is less than falling threshold 304B at time T2; the second IC chip will also trigger 425 the selected response. Each of the IC chips also disables 430 detection of the falling threshold and decouples the capacitor pin from the source of current to prepare the IC chip for another occurrence of the fault.

In the implementation of power supply system 100A where two separate timing events occur, it will be understood that method 400 can be performed independently by each of timing circuits 106, 108. In one embodiment, first timing circuits 106C, 106D use a first capacitor C1 and respective first voltage thresholds 302A, 302B, first falling thresholds 304A, 304B and first rising thresholds 306A, 306B to time an over-current event and to provide a first response, e.g., to trigger turning off of power transistors MPC, MPD if the over-current event persists for a first timed period, while second timing circuits 108C, 108D use a second capacitor C2 and respective second voltage thresholds 302A, 302B, second falling thresholds 304A, 304B and second rising thresholds 306A, 306B to provide a second response, e.g., to delay turning on power transistors MPC, MPD for a second timed period.

It will be recognized that although the performance of systems 100 and 100A has been explained with respect to only two IC chips, the number of IC chips that can be coupled in parallel is limited only by the needs and design of the system and can be a greater number. It will also be recognized that an IC chip that performs as shown in FIG. 4 is able to operate both in a stand-alone mode and also when coupled in parallel with other similar IC chips.

Applicant has demonstrated an IC chip that provides the ability for two or more IC chips to be coupled in parallel and to remain synchronized during operation. The synchronization uses only a single pin that provides both a connection to an external capacitor and a means for monitoring the voltage on the external capacitor. The IC chip is coupled to detect both when a threshold voltage is reached on the capacitor and also when the capacitor voltage is discharged. The latter detection occurs only when the capacitor voltage is less than a falling threshold after having risen above a rising threshold. The IC chip is able to operate either in parallel with similar chips or in stand-alone mode. No additional system circuitry is necessary outside of the IC chips and capacitor.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An integrated circuit (IC) chip comprising:
a first pin adapted to be coupled to an external capacitor; and
a first timing circuit coupled to the first pin, the first timing circuit including:
  a first transistor coupled between the first pin and a first voltage input providing a first voltage and having a control input;
  a second transistor coupled between the first pin and a second voltage input providing a second voltage and having a control input; and
  a first monitor and driving circuit having an input coupled to the first pin, having an output coupled to the control input of the first transistor, having an output coupled to the control input of the second transistor, and having a first response output, the first monitor and driving circuit monitoring the first pin for: a first threshold voltage between the first voltage and the second voltage, the second voltage, and a first response voltage between the first threshold voltage and the first voltage.

2. The integrated circuit of claim 1 in which the first monitor and driving circuit is enabled to monitor for the response voltage when the voltage on the first pin exceeds the first threshold voltage.

3. The integrated circuit as recited in claim 1 including one of a current source and a current sink coupled between the second transistor and the second voltage input.

4. The integrated circuit as recited in claim 3 including:
a second pin adapted to be coupled to a second external capacitor; and a second timing circuit coupled to the second pin, the second timing circuit including:
a third transistor coupled between the second pin and a third voltage input providing a third voltage and having a control input;
a fourth transistor coupled between the second pin and a fourth voltage input providing a fourth voltage and having a control input; and
a second monitor and driving circuit having an input coupled to the second pin, having an output coupled to the control input of the third transistor, having an output coupled to the control input of the fourth transistor, and having a second response output, the second monitor and driving circuit monitoring the second pin for: a second threshold voltage between the third voltage and the fourth voltage, the fourth voltage, and a second response voltage between the second threshold voltage and the third voltage.

5. The integrated circuit of claim 4 in which the first voltage input and the third voltage input are adapted to be coupled to circuit ground and the second voltage input and the fourth voltage input are adapted to be coupled to one of a positive voltage and a negative voltage.

6. The integrated circuit as recited in claim 4 including:
an input voltage input;
an output voltage output;
a power transistor coupled between the input voltage input and the output voltage output, and having a control input; and
a controller having an input coupled to the first response output, having an input coupled to the second response output, and having an output coupled to the control input of the power transistor.

7. The integrated circuit as recited in claim 6 in which the power transistor is a P-type power transistor.

8. The integrated circuit as recited in claim 6 in which the first response output indicates one of resetting the integrated circuit and turning off the power transistor.

9. The integrated circuit as recited in claim 8 in which the second response output indicates turning on the power transistor.

10. A system comprising:
a circuit board;
a first external capacitor mounted on the circuit board;
a first integrated circuit mounted on the circuit board, the first integrated circuit including:
a first pin coupled to the first external capacitor, a first voltage input providing a first voltage, and a second voltage input providing a second voltage;
a first transistor coupled between the first pin and the first voltage input and having a control input;
a second transistor coupled between the first pin and the second voltage input and having a control input; and
a first monitor and driving circuit having an input coupled to the first pin, having an output coupled to the control input of the first transistor, having an output coupled to the control input of the second transistor, and having a first response output, the first monitor and driving circuit monitoring the first pin for: a first threshold voltage between the first voltage and the second voltage, the second voltage, and a first response voltage between the first threshold voltage and the first voltage;
a second integrated circuit mounted on the circuit board the second integrated circuit including:
a second pin coupled to the first external capacitor, a third voltage input providing a third voltage, and a fourth voltage input providing a fourth voltage;
a third transistor coupled between the second pin and the third voltage input and having a control input;
a fourth transistor coupled between the first pin and the fourth voltage input and having a control input; and
a second monitor and driving circuit having an input coupled to the second pin, having an output coupled to the control input of the third transistor, having an output coupled to the control input of the fourth transistor, and having a second response output, the second monitor and driving circuit monitoring the second pin for: a second threshold voltage between the third voltage and the fourth voltage, the fourth voltage, and a second response voltage between the second threshold voltage and the third voltage.

11. The system as recited in claim 9 in which the first integrated circuit includes:
a first input voltage input;
a first output voltage output;
a first power transistor coupled between the first input voltage input and the first output voltage output and having a control input; and
a first controller having an input coupled to the first response output and having an output coupled to the control input of the first power transistor; and
in which the second integrated circuit includes:
a second input voltage input;
a second output voltage output;
a second power transistor coupled between the second input voltage input and the second output voltage output and having a control input; and
a second controller having an input coupled to the second response output and having an output coupled to the control input of the second power transistor.

12. The system of claim 10 in which the first voltage input and the third voltage input are adapted to be coupled to circuit ground and the second voltage input and the fourth voltage input are adapted to be coupled to one of a positive voltage and a negative voltage.

13. A method of operating an integrated circuit comprising:
charging a capacitor from a first voltage to a second voltage;
enabling detection of a response voltage upon a voltage on the capacitor passing through a first threshold voltage between the first voltage and the second voltage;
coupling the capacitor to the first voltage upon the voltage on the capacitor reaching the second voltage;
producing a response in the integrated circuit upon the voltage on the capacitor passing through the response voltage, which is between the first threshold voltage and the first voltage.

14. The method as recited in claim 13 including charging the capacitor with a current source from the first voltage, which is a ground voltage, to the second voltage, which is a positive voltage.

15. The method as recited in claim 13 including charging the capacitor with a current sink from the first voltage, which is a ground voltage, to the second voltage, which is a negative voltage.

16. The method as recited in claim 13 in which producing a response includes turning off a power transistor.

17. The method as recited in claim 16 in which producing a response includes turning on the power transistor.

* * * * *